(12) United States Patent
Kochan

(10) Patent No.: US 6,195,614 B1
(45) Date of Patent: Feb. 27, 2001

(54) METHOD OF CHARACTERIZING EVENTS IN ACQUIRED WAVEFORM DATA FROM A METALLIC TRANSMISSION CABLE

(75) Inventor: Phillip F. Kochan, Redmond, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/054,369

(22) Filed: Apr. 2, 1998

Related U.S. Application Data

(60) Provisional application No. 60/048,247, filed on Jun. 2, 1997.

(51) Int. Cl.[7] .......................... G01R 13/00; G01R 31/11; G06F 19/00
(52) U.S. Cl. ............................. 702/66; 702/59; 324/533; 324/534
(58) Field of Search .......................... 702/57–59, 65–71, 702/73, 74, 81, 79, 115–124, 126, 182, 183–185, 189, 193, 199; 324/76.2, 533, 534; 370/252

(56) References Cited

U.S. PATENT DOCUMENTS

| | | | |
|---|---|---|---|
| 4,970,466 | 11/1990 | Bolles et al. | 324/533 |
| 5,128,619 * | 7/1992 | Bjork et al. | 324/533 |
| 5,144,525 | 9/1992 | Saxe et al. | 365/45 |
| 5,155,439 * | 10/1992 | Holmbo et al. | 324/534 |
| 5,365,328 | 11/1994 | Anderson | 356/73.1 |
| 5,373,356 | 12/1994 | Anderson | 356/73.1 |
| 5,440,528 | 8/1995 | Walsh | 368/113 |
| 5,461,318 * | 10/1995 | Borchert et al. | 324/533 |
| 5,528,356 | 6/1996 | Harcourt | 356/73.1 |
| 5,530,367 | 6/1996 | Bottman | 324/616 |

* cited by examiner

Primary Examiner—Marc S. Hoff
Assistant Examiner—Manuel L. Barbee
(74) Attorney, Agent, or Firm—William K. Bucher; Francis I. Gray

(57) ABSTRACT

A method for characterizing events in acquired time domain reflectometry data from a metallic cable under test uses an edge or event detector for generating an array where positive array elements represent a positive leading edge of an event and negative array elements represent a negative leading edge of an event. Predominantly contiguous groups of positive and negative array elements are identified for defining regions, and elbow points and peak-valley points are determined for the regions having location and amplitude values corresponding to one of the waveform data points. The height for the event is determined as a function of the elbow point and the peak-valley point, and elbow point representing the location of the event and the event height are stored. The edge detector covers a defined number of waveform data points and moves over the waveform data point by point averaging the data within the detector, calculating an estimated noise characteristic and determining top and bottom threshold values at each data point. The thresholds are calculated as the estimated noise characteristic times a constant above the averaged waveform data within the detector. The elbow point is determined as the maximum deviation of the waveform data point from a line defined in relation to the peak-valley point and a point prior to the region in the waveform data.

13 Claims, 11 Drawing Sheets

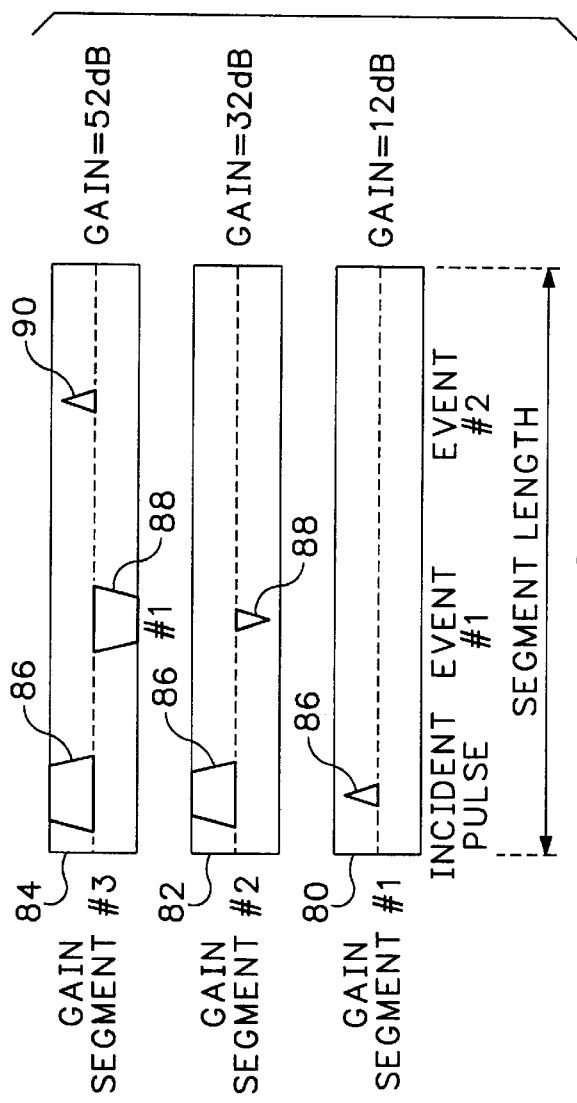

METHOD OF CHARACTERIZING EVENTS IN ACQUIRED WAVEFORM DATA FROM A METALLIC TRANSMISSION CABLE

CROSS-REFERENCE TO RELATED APPLICATIONS

This application claims the benefit of U.S. Provisional application No. 60/048,247, filed Jun. 2, 1997.

BACKGROUND OF THE INVENTION

The present invention generally relates to the event detection and characterization in acquisition of waveform data and more particularly to a method of characterizing events in acquired waveform data from a metallic transmission cable using time domain reflectometry.

A time domain reflectometer (TDR) launches interrogating energy pulses into a transmission medium, such as shielded and unshielded twisted pairs, coaxial cables, and the like, at a given pulse repetition rate, depending upon the designated range of the TDR. During the periods between pulses, acquisition circuitry samples the cable to acquire data representative of reflections from flaws, discontinuities, or breaks in the cable. The reflections in the cable are timed from the time of transmission of the energy pulse to determine the range from the transmitter to such flaws, discontinuities, or breaks. Reflections may represent changes in wire gauge, splices, moisture in the cable, and the like. The acquired data is processed and displayed as a waveform trace on a display device, such as a cathode-ray-tube, a liquid crystal display, or the like.

A TDR notes any changes in the characteristic impedance of the cable under test. For a telecommunications copper facility or plant, the characteristic impedance is typically between 100 and 125 ohms. Most unshielded cables fall between 100 and 105 ohms. Shielded cable like T1 is typically about 125 ohms. Any change in the cable's impedance is displayed on the TDR display device as an upward bump, downward dip, or some combination of both deviating from a horizontal trace.

The TS100 and the TV110 Time Domain Reflectometers, manufactured and sold by Tektronix, Inc., Beaverton, Oreg. and assignee of the instant invention, are examples of TDRs for respectively characterizing telephone twisted pair cables and coaxial cable, such as in cable television systems and the like. The TV110 automatically selects the pulsewidth of the interrogating pulse and the gain of the receiver based on the initial span of the instrument. The acquisition hardware in the TV110 acquires a single data point for each launched interrogating pulse. Timing circuitry in the acquisition hardware varies the sample strobe timing in relation to the launched interrogating pulse to acquire data points at different time intervals to build a waveform data set over the selected transmission cable span. Increasing the span causes the instrument to select a new pulsewidth and gain and to reacquire new data samples over the new range. The acquired waveform data set is displayed on a liquid crystal display device and movable cursors are provided for locating the position of displayed faults.

U.S. Pat. No. 4,970,466 describes a multi-function test set for testing local area networks or LANs. A TDR function is described where a successive approximation routine is used to determine the signal level on the LAN cable. Predetermined offsets are added to the successive approximation results to set a baseline comparison amplitude for the TDR test. An interrogating pulse is launched into the cable at the same time a counter starts counting a 100 MHZ clock signal. Any return reflection from the cable that exceeds the baseline comparison amplitude stops the counter. The counter results times the clock rate in seconds times the velocity of propagation of the cable divided by two gives the approximate distance to the event. Repeated interrogations of the cable are made and averaged to improve the distance accuracy to the fault. While this reference detects the presence of major events in a cable, it does not calculate the height of an event nor does it calculate a return loss. Further, the base line comparison amplitude limits the ability of the instrument to locate small amplitude return reflections in the cable which could be impairing the cable quality. In addition, smaller faults farther down the cable after a major fault are not detected.

U.S. Pat. No. 5,128,619 describes a system and method for determining cable characteristics that uses a computer and a time domain reflectometer, such as the Tektronix 1503B, manufactured and sold by the assignee of the instant invention. The computer utilizes an application program to access data acquired by the TDR and calculates the length, attenuation, impedance, and existence of any bridge taps and other discontinuities on the selected pair of wires in a cable. One of the objectives of this invention is to detect significant discontinuities that will not allow the operation of digital telephones or digital communication on the cable. A significant discontinuity in this context is defined in the reference as an impedance change that is equal to or greater than twice the cable impedance or equal to or less than one half the cable impedance. The application program calculates the first, second, and third derivatives of the plurality of time samples of the acquired waveform data from the TDR. The width of the incident pulse is used to establish threshold values for clearing counters, finding a pulse edge, and zeroing all counters and flags. The software moves through the waveform data counting first derivatives or slopes of the data to determine valid pulse edges. If the positive or negative slope counter exceeds the pulse edge counter, a flag is set and the software determines if the peak amplitude of the event exceeds an amplitude threshold limit. This threshold limit is set to qualify significant events which would disqualify the cable from being used for digital communications. If the event amplitude exceeds the threshold, the second derivative is examined on each point from the pulse's peak location back toward the start of the pulse to determine where the second and third derivatives approximate zero. Using the slope of the second derivative zero crossing, the point where the slope has dropped to 18% of its value at the second derivative zero is found. Using the second derivative zero crossing point, the third derivative zero crossing point, and the 18% slope crossing point, the start of the pulse is calculated. While this method finds the starting point of the event, it is computationally expensive in that the first, second, and third derivatives of all of the waveform data points need to be calculated to determine the location of the event. Additionally, any noise on the waveform will have an adverse affect on the calculated derivatives. Further, this method does not calculate the return loss of the event.

U.S. Pat. No. 5,461,318 describes a time domain reflectometer that automatically determines certain characteristics of events in twisted pair cables. The TDR acquires and displays a trace of the acquired waveform data and automatically places cursors at the start of the incident pulse and at the start of a reflected pulse. However, the reference does not describe or hint at how the instrument determines the start of these events. Accurately determining the start of an event is necessary in making accurate distance measurements. The TDR further calculates the return loss of the event. This is accomplished in the reference by determining the minimum and maximum values for the incident pulse and the reflected pulse. The waveform in front of the respective pulses is scanned to determine minimum values for each. The maximum values for the pulses are determined by scanning to the right of the cursors. The differences between the respective minimum and maximum values are the respective amplitudes of the pulses. The return loss is calculated from the well known equation RL=20 log (incident pulse height/reflected pulse height). However, the reference does not teach or hint at how the minimum values of the event are calculated. Accurately determining pulse heights is important in accurately determining the return loss of an event. The distance to the event is determined by calculating the distance between the cursors and applying the velocity of propagation correction factor to the calculated distance. The distance to an event is only as accurate as the placement of the cursors at the start of the event and this has not been described in the reference. It can only be assumed that the cursors are manually placed by the user.

In the field of optical time domain reflectometry (OTDR), automated waveform acquisition and event detection and characterization has progressed farther than with metallic time domain reflectometers. U.S. Pat. No. 5,155,439, assigned to the assignee of the present invention, describes an optical fault locator that launches optical pulses into a test fiber at a first pulse width. The return reflected optical signal is converted to an electrical signal, digitized, stored and processed to locate anomalous events in the fiber. Any region of the test fiber having an anomalous event is reexamined using optical pulses having a pulse width optimized for that region of the fiber. A symbolic display is used to indicate the location and type of event located in the fiber instead of the traditional waveform trace.

U.S. Pat. No. 5,528,356, assigned to the assignee of the present invention, describes an OTDR that acquires and stores waveform data points having multiple waveform segments with each waveform segment having data points acquired using different pulsewidths, sample spacings and starting distances. Each waveform segment is defined in terms of the noise floor. The gain of the OTDR receiver amplifier may be increased for the various waveform segment acquisitions in conjunction with other parameters, such as the pulsewidth, averaging and the like, to increase the signal to noise ratio within the segment.

U.S. Pat. No. 5,365,328, assigned to the assignee of the present invention, describes a method for characterizing an event in acquired digital OTDR data where the event has a known shape, and a pattern having amplitude and location coefficients is applied to the data for determining a best fit between the data and the pattern as a function of a peak RMS value. This method is useful in characterizing nonreflective events in the OTDR data. However in metallic time domain reflectometry, it is very difficult to categorize the return reflective events to any particular shape without extensive computational effort. This would require a great deal of storage space for the algorithms performing the computations. In addition, the time required to perform the computations would far exceed the time a user would allow for receiving results from a cable examination.

SUMMARY OF THE INVENTION

Accordingly, the present invention is a method of characterizing events in acquired waveform data from a metallic transmission cable wherein the waveform data is an array of data points acquired at selected pulsewidths for the interrogating pulses and at selected receiver gain settings with each point having a location value and an amplitude value. The steps include generating an array representative of an event in the acquired waveform data where positive array elements represent a positive leading edge of an event in the waveform data and negative array elements represent a negative leading edge of an event in the waveform data and identifying predominantly contiguous group of positive and negative array elements defining a region. An elbow point and a peak-valley point are determined for the region having location and amplitude values corresponding to one of the waveform data points. The height for the event is determined as a function of the elbow point and the peak-valley point, and the elbow point representing the location of the event and the event height are stored.

The generating step further includes the steps of establishing a starting point in the waveform data for generating the array, defining a detector containing a defined number of waveform data points for generating the array elements, averaging the waveform data within the detector, and calculating an estimated noise characteristic of the waveform data within the detector. Top and bottom threshold values are calculated as the estimated noise characteristic times a constant value above and below the averaged waveform data within the detector for comparing with waveform data point amplitude values for generating array elements. A data point distance beyond the detector is established for comparing the thresholds values with the waveform data point amplitude values along with establishing a detector advancement rate. The detector is advanced over the waveform data points with the waveform averaging of the data with the detector, the calculating of the noise characteristic and the top and bottom threshold values being repeated for each advancement of the detector.

The starting point estimating step further includes the steps of determining the existence of an incident pulse in the acquired waveform data and moving the starting point within the waveform data by a distance equal to the pulsewidth of the incident pulse times a skip factor constant The noise characteristic calculating step further includes the step of determining the mean absolute deviation of the waveform data within the detector. The method of the present invention further includes generating a positive array element when the waveform data point amplitude value is greater than the top threshold value and generating a negative array element when the waveform data point amplitude value less than the bottom threshold value.

The step for determining an elbow point and peak-valley point further includes the steps of setting the largest waveform data point amplitude value over a distance starting at the beginning of the region and ending two region widths to the right of the peak-valley point, defining a line segment having a first point whose location is prior to the beginning of the region and a distance equal to the larger of either a find elbow line factor constant times the region width or a detector halfwidth constant and a second point whose location is the left most of either the middle of the region or the peak-valley point, and determining a point of maximum absolute difference or deviation between waveform data point amplitude values and the line segment.

The method of the present invention further includes the steps of filtering out a region having a width smaller than a region width constant, filtering out a region having an event height less than a height constant, and filtering out a region having elbow point amplitude value greater than saturation event constants. Additional steps of the present invention are calculating a return loss value for the event and storing the return loss value for the event, the receiver gain setting for the event, and the pulsewidth of the interrogating pulses for the event.

The objects, advantages and novel features of the present invention are apparent from the following detailed description when read in conjunction with the appended claims and attached drawings.

BRIEF DESCRIPTION OF THE DRAWINGS

FIG. 3 is a graphical representation of three gain segment acquisitions of waveform data in the time domain reflectometer using the method of characterizing events in acquired waveform data from a metallic transmission cable under test according to the present invention.

FIG. 4 is a graphical representation of an event table containing characterization data for detected events using the method of characterizing events in acquired waveform data from a metallic transmission cable under test according to the present invention.

DETAILED DESCRIPTION OF THE PREFERRED EMBODIMENT

The method of characterizing events in acquired waveform data from a metallic transmission cable according to the present invention receives time domain reflectometry waveform data acquired in multiple gain segments over one or more segment lengths in the cable under test. The time domain reflectometer preferably functions in multiple modes to acquire the waveform data in the multiple gain segments. One mode has greater user input for defining acquisition parameters and selecting a cable segment length while another mode requires limited user input for automatically generating the gain segment acquisitions and multiple segment lengths in the cable. The method of characterizing events in time domain reflectometry data will be described using the first mode above but functions equally as well on waveform data automatically generated using the gain segment acquisitions and multiple segment lengths in the cable.

Figure 1:
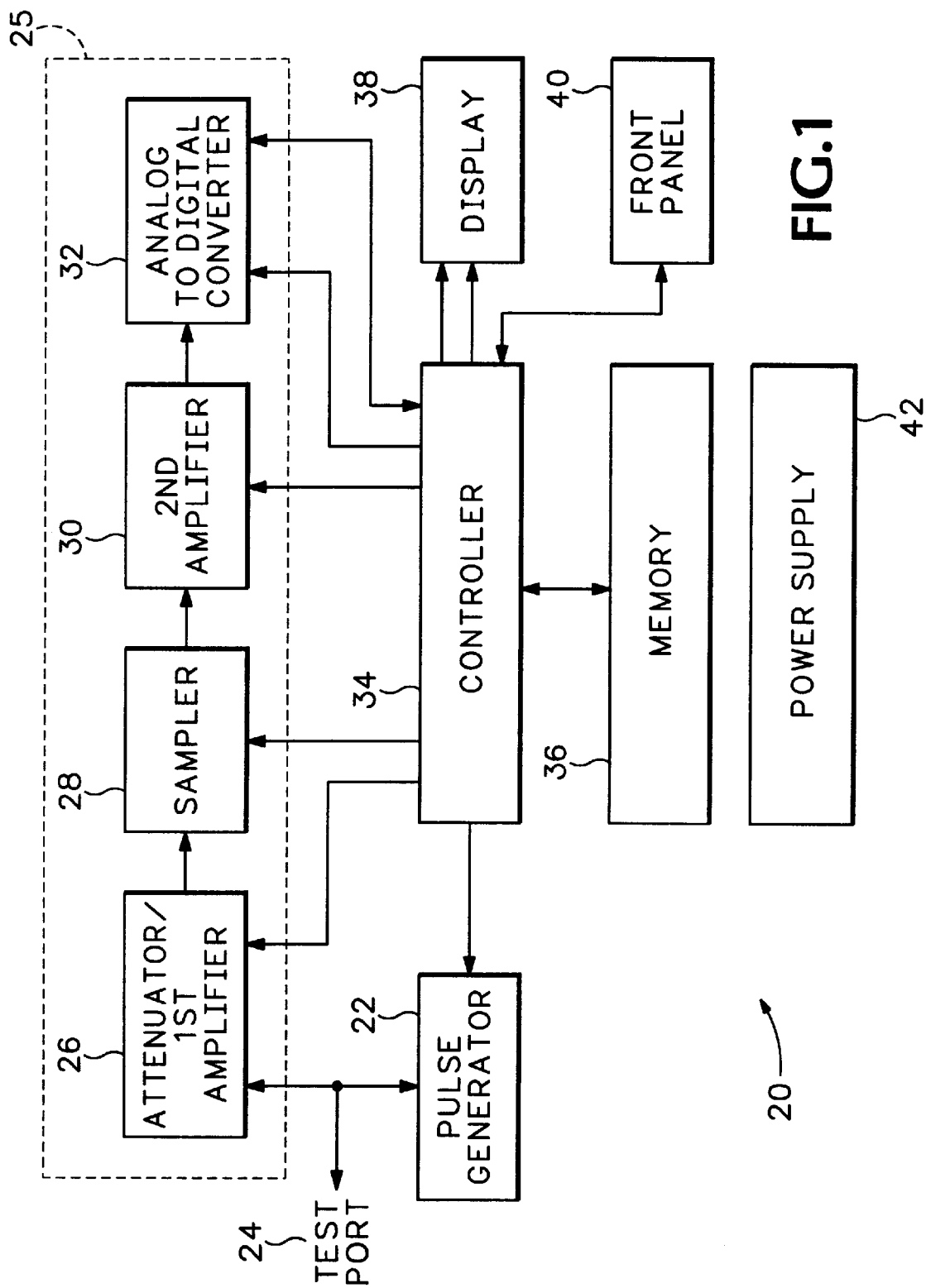
FIG. 1 is a representative block diagram of a time domain reflectometer using the method of characterizing events in acquired waveform data from a metallic transmission cable under test according to the present invention.

Referring to FIG. 1, there is shown a block diagram of a time domain reflectometer (TDR) instrument 20 implementing the method for characterizing events in acquired waveform data from a metallic transmission cable according to the present invention. A transmitter, such as a variable pulse generator or the like, 22 produces interrogating energy pulses that are launched into a transmission medium under test via a test port 24. The transmission medium may be shielded or unshielded twisted pairs, coaxial cables, or other types of metallic transmission mediums. Return signal energy from events in the cable under test representing flaws, discontinuities, or breaks in the cable is coupled to a receiver 25 having an attenuator/first amplifier 26. The output of the attenuator/first amplifier 26 is coupled to a sampling circuit 28, such as a sample and hold circuit. The sampled analog signal is coupled to a second amplifier 30 for conditioning the sampled signal level to the appropriate level of analog-to-digital converter (ADC) 32. The ADC 32 converts the sampled and conditioned analog signal to digital values representative of the return signal from the cable under test. The digitized values are coupled to microprocessor 34, such as a Motorola 68330, for processing in the digital domain. The processor stores the digital values in memory 36 that includes flash and DRAM. Memory 36 further includes read only memory (ROM) containing programmed control instructions for controlling the acquisition functions of the TDR 20 and processing instructions for the acquired data from the cable under test. The processor 34, under program control, generates trigger pulses for the variable pulse generator 22 for initiating the generation of interrogating pulses, controls the attenuation and gain settings of the attenuator/first amplifier 26, the gain of the second amplifier 30, the timing of the sampling circuit 28 and the ADC 32 in relation to the trigger pulses, and the down loading of the ADC 32 digital data. The digital data representing the return signal energy from the cable under test is processed under program control to detect the presence of events in the cable and generate characterization data on the detected events. The digitized waveform data along with acquisition parameter data and the characterization data of the detected events are output to display device 38, such as a cathode-ray-tube, liquid crystal display, or the like. Display processing may be performed by the microprocessor 34 or by a separate display processor (not shown) coupled to receive the processed data from the microprocessor 34. Front panel 40 is coupled to the microprocessor 34 and includes input devices, such as buttons, knobs, soft keys, and the like for initiating examination of the transmission medium and manually setting various TDR 20 parameters, such as the pulsewidth of the interrogating pulses, the instrument gain, sample spacing, measurement range, and the like. Power supply 42 provides operating voltages to the various circuits of the TDR 20.

The receiver 25 in TDR 20 may be viewed as a waveform digitizer similar to that used for digitizing waveforms of input signals in a conventional digital storage oscilloscope. The waveform digitizer is operated in a conventional mode known in the art as sequential sampling wherein samples, acquired from a number of repetitive signals, are later reconstructed in an equivalent time record representing one real-time signal. In the preferred embodiment of the invention, the sampler 28 in receiver 25 consists of an analog acquisition system as described in U.S. Pat. No. 5,144,525, assigned to the assignee of the instant application. The FISO (Fast-In, Slow-Out) data acquisition system is capable of sampling at sub-nanosecond intervals providing data acquisition of both periodic and non-periodic waveforms. In time-domain reflectometry applications, this allows for complete acquisition of an M×N data field with a single interrogating pulse. It further provides for very fast vertical and/or horizontal averaging and very low bit collision time (or time-out) when used in testing live LAN or other digital services. The use of a FISO data acquisition system provides for live testing of synchronous services, i.e., video, resulting in no visible artifacts.

The use of the FISO data acquisition system in the TDR 20 of the present invention, because of its speed and internal design methodology, can retrieve complete and very large data fields from a single generated interrogation pulse. Since the FISO acquisition time is very small, requiring only a single interrogating pulse from the variable pulse generator 22 to collect an entire M×N sampled data field, high levels of numerical averaging can be accomplished by generating successive pulses. The end result is an increase in signal-to noise ratio S/N by the root of the number of samples. While current TDRs may be able to average, large numerical averages cannot be accomplished in a time-frame deemed acceptable to the user and, because horizontal pixels are not sampled without generating additional interrogating pulses, horizontal averaging while using a single interrogating pulse cannot be accomplished. TDR vertical averaging is most useful in identifying minute faults at long cable distances and/or in the presence of interference noise. TDR horizontal averaging can increase time or distance accuracy of precision TDR instruments. A "running average" is performed numerically on the acquired data by the internal processor allowing an immediately viewable TDR displayed waveform with increasing S/N as the averaging process precedes with respect to time. Collecting a complete M×N sample array, which completely characterizes the cable under test with a single interrogating pulse, avoids nearly all bit collisions when characterizing a live LAN or other digital cable information. Also, for periods equal to only a single interrogating pulse, or n times the interrogating pulse (if averaging is employed) n being the number of averages, the LAN or other digital sending unit can "time-out" for this very short duration, thereby minimizing the net idle time. Advantages also exist for more synchronous applications, such as video. An entire cable can be characterized within a horizontal or vertical blanking interval when the interrogating pulse is slaved to the video synchronization signals. A further benefit of this approach is that it avoids any visual abnormalities in the active (viewed) video resulting from the generated TDR pulse.

Figure 2:
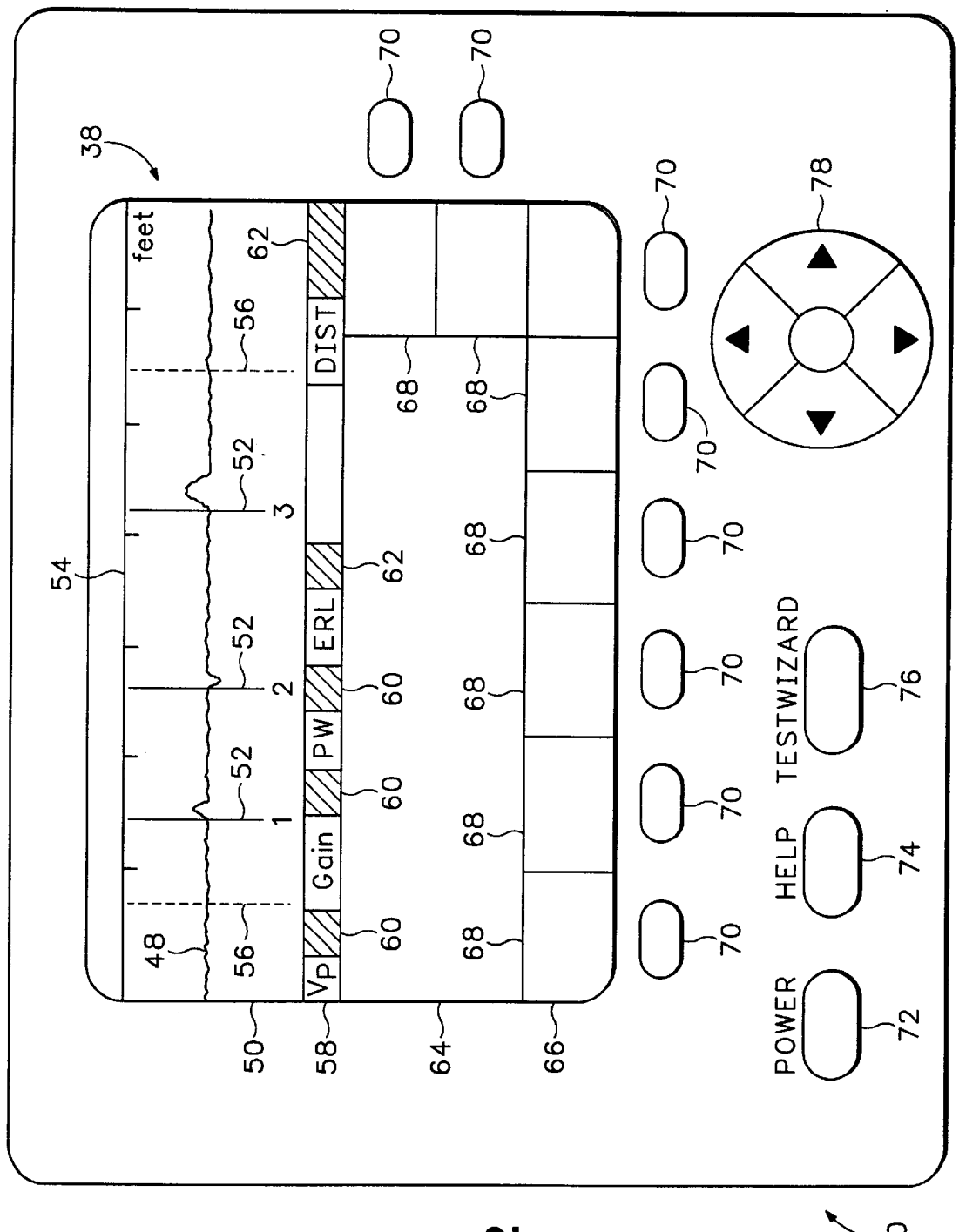
FIG. 2 is a representation of the front panel of the time domain reflectometer using the method of characterizing events in acquired waveform data from a metallic transmission cable under test according to the present invention.

Referring to FIG. 2, there is shown a representation of the front panel 40. The front panel includes the display device 38 which in the preferred embodiment is a 640×480 pixel liquid crystal display. The display device 38 is divided into a number of regions for presenting various types of data. The waveform data 48 is displayed in regions 50 along with identified event locations 52, a distance scale 54 and cursors 56. Below region 50 is a region 58 for displaying acquisition parameter data 60 and event characterization data 62. Region 64 displays user prompts for operating the instrument and user input information, such as cable identification data. Region 66 contains a series of display regions 68 that indicate the type of function associated with softkeys 70 positioned on the periphery of the display device 38. The functions of the softkeys 70 and the associated display regions are controlled by the instrument software and vary depending on the instrument mode. A power button 72 turns the power on and off for the instrument. A help button 74 brings up on the display device 38 internally stored help instructions for operating the instrument. An auto test button 76 initiates the automatic gain segment acquisitions over multiple segment lengths mode and displays the resulting acquired data. Horizontal and vertical movement keys 78 are used for moving within the waveform display region 50 or to select parameters in various pull down menus.

As previously stated, the TDR 20 has one mode for selecting a cable segment length and more involved user input for defining acquisition parameters. The user selects acquisition parameter settings using the front panel softkeys 70. The instrument generates a connect cable request on the display device 38 when the power is turned on. The span or segment length of cable to be tested and the cable type are entered along with the pulsewidth of the interrogating pulses generated by the pulse generator 22 and the gain of the receiver 25 for the displayed data. The user may also set the amount of signal averaging, a threshold value for marking events greater than the threshold as well as turning event marking on or off using the softkeys 70. The threshold value may be set in a range of 0 dB to 72 dB in the present embodiment. However, the range of the threshold values is not limited to these specific values and other threshold range values may be used without departing from the scope of the invention. The event threshold values relates to the return loss (RL) of the event. Return loss and event return loss (ERL) are used for describing the loss of an event. Return loss is defined by the equation: RL=20 log(incident pulse height/reflected event height) where the event heights are measured in any units, such as volts, pixels, ADC counts. Event return loss is calculated by finding the return loss for a particular event at a particular location or distance and subtracting out the line loss, also called cable attenuation. An open or short in the cable is the most severe passive event and should have an ERL of 0 dB at any location in the cable. In contrast, the return loss of an open or short would start at or near 0 dB at the front panel of the instrument and increase as it was moved farther from the front panel due in part to the cable attenuation.

Upon initiation of the cable examination, interrogating pulses are launched into the cable under test at a periodic rate. During the periods between the pulses, multiple gain segment acquisitions of waveform data are made over the cable segment length using different receiver gains. The initial gain setting for the first gain segment acquisition is set at 12 dB based on empirically derived noise envelope data. This lowest gain setting raises the largest ERL event far enough out the noise envelope to be detected by an event marking program. Lower gain settings are available in the system, such as 0 dB and 6 dB gain settings, but these settings would not evaluate a short or an open event above the noise floor of the current instrument design. The lower gain settings are available for use with instruments having improved noise floor characteristics. It should also be noted that the initial pulse height for the various pulsewidths of the interrogating pulses is also acquired at the 12 dB gain setting. The gain setting may be set higher as long as the pulse is linear and not saturated. A table of fixed gain settings is stored in read-only memory portion of memory 36 and contains gain settings of: 0 dB, 6 dB, 12 dB, 20 dB, 26 dB, 32 dB, 40 dB, 46 dB, 52 dB, 60 dB, 66 dB, and 72 dB and are determined by the linear dynamic range of the ADC 32. Other fixed gain settings or dynamically calculated gain settings may be employed in this invention without departing from its scope.

The steps between gain settings are determined by many factors. These factors include the linear dynamic range of the ADC 32, the level of the noise floor in the waveform, the ability of the event marking program to find events which deviate from the noise floor, the time constraint placed on the acquisition time by the user, and the highest gain setting available in the instrument. In determining the size of the gain steps, minimizing the number of acquisitions, and thus the time, was taken as the basic constraint. Minimizing the number of acquisitions results in maximizing the gain steps. The following process is used in determining the maximum steps between gain settings using an ADC with a dynamic range of 256. Because there are positive and negative events in the return signal from the cable under test, the dynamic range is halved to 128. Assuming the maximum peak-to-peak noise level over a given range is N and the event marking program can detect events that are M times N/2 or larger, then the maximum allowable gain step for acquisitions is given by the formula 20*log(128(M×N)). In the actual implementation of the invention, the gain steps were chosen to be less than the maximum allowable to prevent an undetected event at one gain setting from being saturated at the next gain setting.

Preferably, three gain segment acquisitions of waveform data are made for each segment length. Referring to FIG. 3, there is shown a graphical representation of three gain segment acquisitions of waveform data 80, 82, and 84 over a segment length of cable. The acquisitions are made with the same beginning location and sample spacing or delta, but with different gain settings. The triangle and rhombedral objects in the figure represent events in the cable. The triangle objects represent events that are S within the dynamic range of the ADC 32 and the rhombohedral objects represent events that exceed the dynamic range of the ADC 32. Objects above the dotted lines represent events with increased impedance and those below the line represent events with decreased impedance relative to the actual or typical impedance of the cable. In the representation, the left most event 86 is the incident pulse caused by the reflection of the interrogating pulse at the instrument-cable interface and is not counted as an event. Event #1, labeled 88, is a negative impedance change event that is first detected in the second gain acquisition 82 but not at the lowest gain setting of the gain segment acquisition 80. Event #1 88 is out of range of the ADC 32 at the highest gain setting of the gain segment acquisition 84. Event #2, labeled 90, is less severe than Event #1 88 and is only detected at the highest gain setting of the gain segment 84. The appearance and detection of events at different gain settings over the same segment length of cable is the fundamental reason why the same section of cable needs to be acquired at a range of gain settings in a system with a limited dynamic range in its ADC.

The acquired waveform data for each gain segment is stored and events marked using an event detection program implementing the method for characterizing events in acquired waveform data according to the present invention. The detected events for each gain segment are stored in an event table as representatively shown in FIG. 4 for the events in FIG. 3. The event table may be viewed as a single event table that distinguishes between the various events acquired at different gain settings or as individual tables for each gain segment acquisition. Preferably, one event table is generated and reused for each gain segment acquisition. The event table is loaded with detected event data for one gain segment while the next gain segment waveform data is being acquired. The event data for the first segment is passed to an overlapped event table or a mosaic event table. The event data for the second segment overwrites the previously stored event data in the event table. The implemented event tables contain an index into the tables, the pulse width of the interrogating pulse, the gain setting for the marked event, the position of the event, the return loss of the event, the end or width of the event, the height of the event, and whether it is an echo. Amplitude values in the event tables are stored as ADC 32 counts or converted to volts, dBs, display pixel counts or the like. The horizontal or distance values may be stored as waveform data point counts, an index into the waveform data, time or distance in feet or meters. The waveform data point count can be multiplied by the sample spacing value, which may be a time or distance value, to give the location of the waveform data point. If the sample spacing is a time value, then the sample spacing times the velocity of propagation for the cable times the waveform data point count divided by two gives the waveform data point location. The multiplied values are divided by two to take into account the two way travel time of the interrogating pulse and the return signal in the cable. In the preferred embodiment of the present invention, the horizontal values are expressed as "x" values which are equal to 15.625 picoseconds. The method for determining whether an event is an echo is described in U.S. Pat. No. 5,373,356, assigned to the assignee of the present invention. The above listed characterization data for events in the implemented event tables provide a thorough description of the event for the user and other events tables may be generated containing less characterization data without departing from the scope of the claimed invention.

Figure 5:
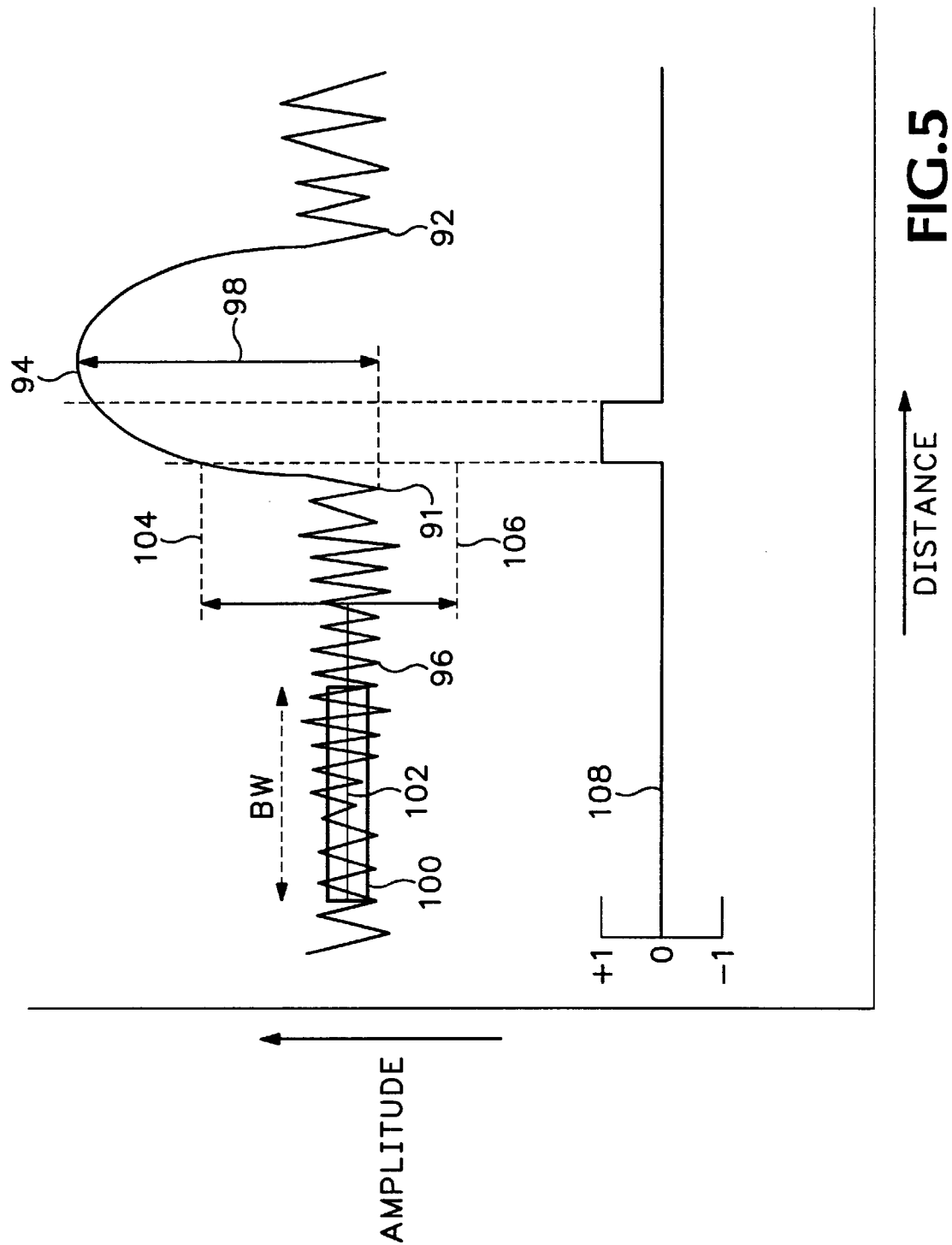
FIG. 5 is a graphical representation of an event in the acquired waveform data that is characterized using the method of characterizing events in acquired waveform data from a metallic transmission cable under test according to the present invention.

Referring to FIG. 5, there is a graphical representation of an event in the acquired gain segment waveform data showing pertinent points in the data for characterizing the event. The event includes an elbow point 91 defined as the point of maximum bend at the beginning of the event and an end point 92 defined as the point of maximum bend at the end of the event. The peak-valley point 94 of the event is defined as the highest point for a positive going event or the lowest point for a negative going event. The noise floor 96 is defined as a section of waveform data that is assumed to be free of events. The height 98 of the event is defined as the vertical distance between the elbow point and the peak-valley point. An event or edge detector 100 is representatively show as a box in the figure having a constant width BW. A line 102 drawn through the edge detector 100 and the noise data represents the average of all the points within the box 100 and is called the Box Average. The dashed horizontal lines 104 and 106 above and below the noise data respectively represent top and bottom thresholds that are compared to the waveform data. A deviation array as represented by line 108 is generated when the waveform data exceeds these thresholds 104, 106.

The event marking program according to the present invention contains a number of constant tuning parameters which are stored in memory 36 ROM. The tuning parameters are written in all capital letters with underscore delimiters and are described as follows.
Define
 WfmDataType MAX_RETURN_LOSS_ALLOWED= 124: Absolute value of the Return Loss is filtered to this amount.
Constants
 WfmDataType MULTIPLE_THRESH=5: Determines the number of box heights the waveform must go above (below) the top (bottom) of the Box to cause a deviation to be marked.
 WfmDataType MIN_BOX_THRESH=5: The smallest the box threshold is allowed to become. This protects against the no noise situation where the box height is zero.
 Integer BOX_HALFWIDTH=10: The width of the box inside which the waveform's average deviation is calculated; and (a half of a box width) in front of which the waveform is checked for deviation from the starting and ending halfwidth of the boxes which are moved along the waveform to find deviations; these deviations are then grouped into regions.
 Integer REGION_MIN_WIDTH=1: The minimum region width should roughly scale linearly with box width.
 Integer SATURATED_EVENT_FACTOR=2: When an event is saturated it takes time for electronics to unsaturate; this widens events; this factor is used to widen the estimated event width; the widening occurs by adding SATURATED_EVENT_FACTOR times the distance from the elbowPoint to where the event goes below (above) the SATURATION_TOP (BOTTOM)
 WfmDataType SATURATION_TOP=240 When the waveform goes above this value, it is saturated.
 WfnDataType SATURATION_BOTTOM=15 When the waveform goes below this value, it is saturated.
 Integer FIND_ELBOW_LINE_FACTOR=2: This constant is used to determine where to locate the left most point for the line used to find the elbowPoint of a region. The factor times the regionWidth is how far the algorithm goes backwards from the beginning of the region to the left most point for a line used to find the elbowPoint. (Note; if the region is not filtered out and becomes an event then this elbowPoint is the beginning of the event)
 Integer FIND_PEAK_VALLEY_FACTOR=2: This constant is the number of regionWidths we look forward from the end of the region to find the peakvalleyPoint.
 Integer MIN_PIXEL_LOSS_HEIGHT=2:
 WfmDataType OFF_THE_CLIFF_HEIGHT=235
WfmDataType OUT_THE_VALLEY_HEIGHT=20
 NOTE: Closely related to SATURATION_TOP (BOTTOM) limits for the OFF_THE_CLIFF or OUT_THE_VALLEY filter, the event edge detector catches the end or backside of a saturated event and these "false" events are filtered by looking at the height of the elbowPoint. If it falls outside of these limits, then the event is filtered.
 Integer INCIDENT_SKIP_FACTOR=3: This factor is multiplied by the width of an incident pulse to determine how far past the zero point of the waveform to start event marking.
 Integer PARTIALLY_CONTIGUOUS_TOLERANCE=3: This quantity is added to the sum of the widths of two regions which is used to determine whether two adjacent events are partially contiguous.
 Integer MIN_BETWEEN_REGIONS=10: Partially contiguous regions are defined to be two regions which are within the larger of either the sum of their widths (plus PARTIALLY_CONTIGUOUS_TOLERANCE or MIN_BETWEEN_REGIONS of each other).

Figure 6:
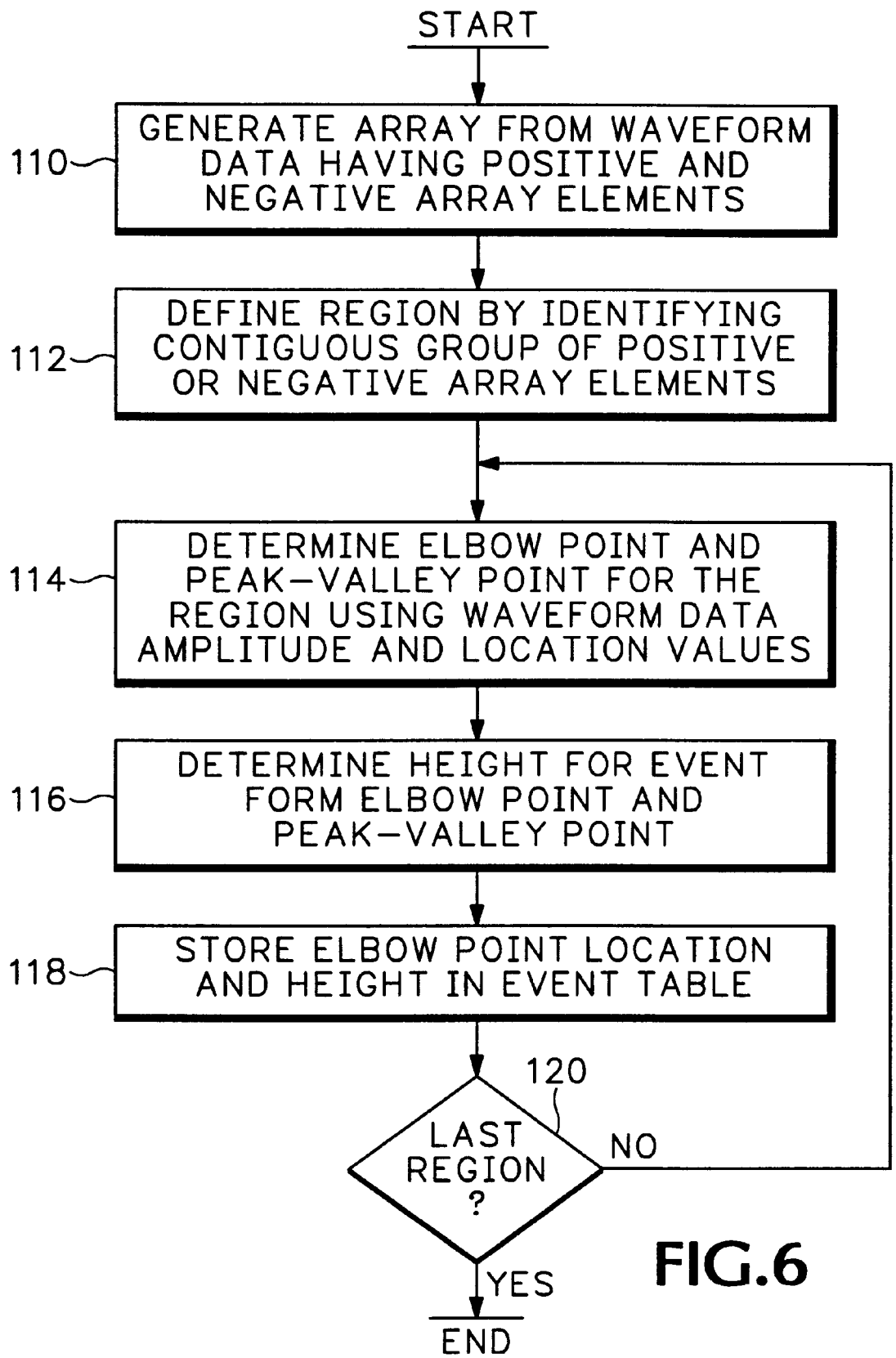
FIG. 6 is a flow chart showing the steps in the event detection program for characterizing an event in the method of characterizing events in acquired waveform data from a metallic transmission cable under test according to the present invention.

The event detection program as shown in the flow chart of FIG. 6 uses the event detector 100 to generate an array, as shown in step 110, representative of the event in the acquired data. This array is called the deviants array and contains +1 array elements representing the leading edge of positive events and −1 array elements representing the leading edges of negative events. The deviants array is searched to identify contiguous groups of +1 and −1 which are respectively logged as positive and negative going regions as indicated in step 112. The elbow point and the peak-valley point for the region are determined using the location and amplitude values of the pertinent waveform data points as shown in step 114. The height of the event is determined by subtracting the elbow point value from the peak-valley point value as depicted in step 116. The elbow point location and the height of the event are stored in the event table as shown in step 118. Each of the defined regions are characterized and the pertinent data is stored in the event table as shown by the decision step 120.

Figure 7:
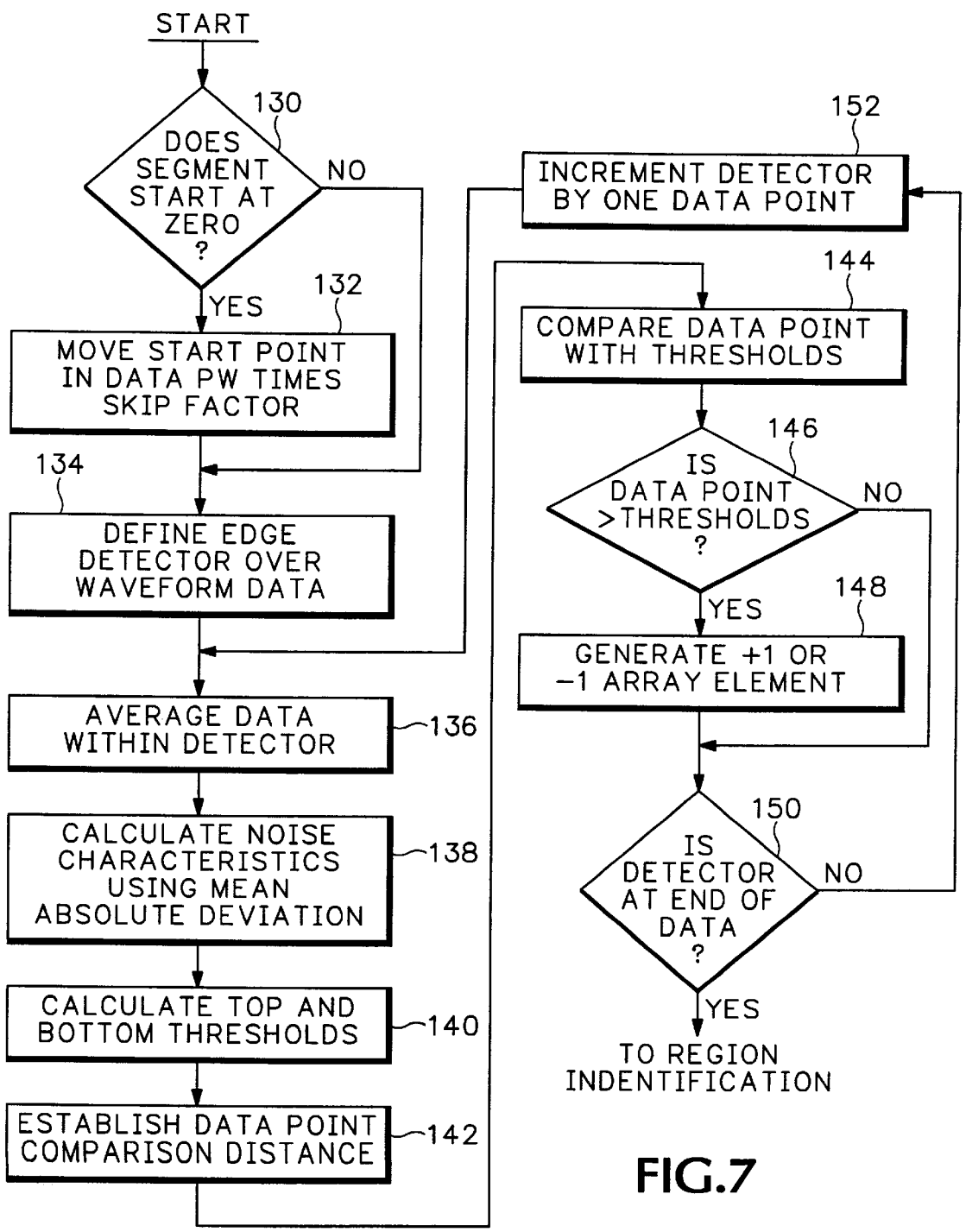
FIG. 7 is a flow chart showing the steps in generating a deviants array in the method of characterizing events in acquired waveform data from a metallic transmission cable under test according to the present invention.

Referring to the flow chart of FIG. 7 and FIG. 5, a starting point is established in the waveform data for generating the deviants array. As previously stated, the incident pulse is not considered an event and therefore is not marked. If the span of the waveform segment starts at zero as shown in step 130, the system moves the starting point in the waveform data for the event marking program a distance equal to the INCIDENT_SKIP_FACTOR times the incident pulse width as shown in step 132. This moves the start of the event detection program past the incident pulse. The edge detector 100 in FIG. 5 is defined having a constant width equal to twice the BOX_HALFWIDTH and contains waveform data points for locating regions of the waveform data which may contain the leading edge of an event as shown in step 134. The Box Average 102 is calculated from the waveform data within the detector as shown in step 136. Within the detector 100, the noise characteristic of the waveform data is calculated using the Average Deviation ( also called the mean absolute deviation) of the waveform as shown in step 138. The average deviation differs slightly from standard deviation in that the average deviation is less susceptible to outlier data points than the standard deviation. The average deviation is give by the following equation:

$$Adev(N) = (1/N)\sum_{j=1}^{N}|\lambda_j - \overline{\lambda}|$$

where N is the number of data points and $\lambda_j$ is the value of the jth data point. The Average Deviation is used as a local estimate of the noise characteristics of the waveform. The top and bottom thresholds 104 and 106 are determined as shown in step 140 and are compared with waveform data points to generate the deviants array 108. The top threshold 106 is defined as a distance equal to the Average Deviation times the MULTIPLE_THRESH above the Box Average 102. The bottom threshold 106 is this same distance below the Box Average 102. A MN_BOX_THRESH is set to prevent the thresholds from becoming zero for no noise situations where the Average Deviation would be zero. A data point distance in front of the edge detector 100, defined as the BOX_HALFWIDTH, is established for comparing the threshold values with the waveform data point amplitude values as shown in step 142. The waveform, at the BOX_HALFWIDTH distance in front of the detector 100, is checked for deviations above the top threshold 104 or below the bottom threshold 106 as shown in step 144. If the waveform is found to deviate above the top threshold 104, then a +1 is entered into the deviants array 108. If the waveform is found to deviate below the bottom threshold 106, then a −1 is entered into the deviants array 108 as shown in steps 146 and 148. For the position of the edge detector 100 shown in FIG. 5 the waveform does not deviate. The edge detector 100 increments through the waveform data point by point starting from the first acquired data points to the last acquired data points (left to right in the figure) as indicated in steps 150 and 152. In the case shown in FIG. 5, when the edge detector 100 moves forward about 10 data points from its present the waveform exceeds the top threshold 104. The waveform continues to exceed the top threshold 104 for the next five or more data points creating a contiguous group of +1's in the deviants array 108. The beginning of this group is labeled begin region and the end is label end region. Once the right edge of the edge detector box 100 reaches the elbow point of the event, the Average Deviation will increase. This pushes the top threshold higher and bottom threshold lower, respectively, and avoids marking of the trailing edge in the deviants array. It also avoids marking deviations in more complicated events which can have multiple oscillations of varying amplitude.

Figure 8:
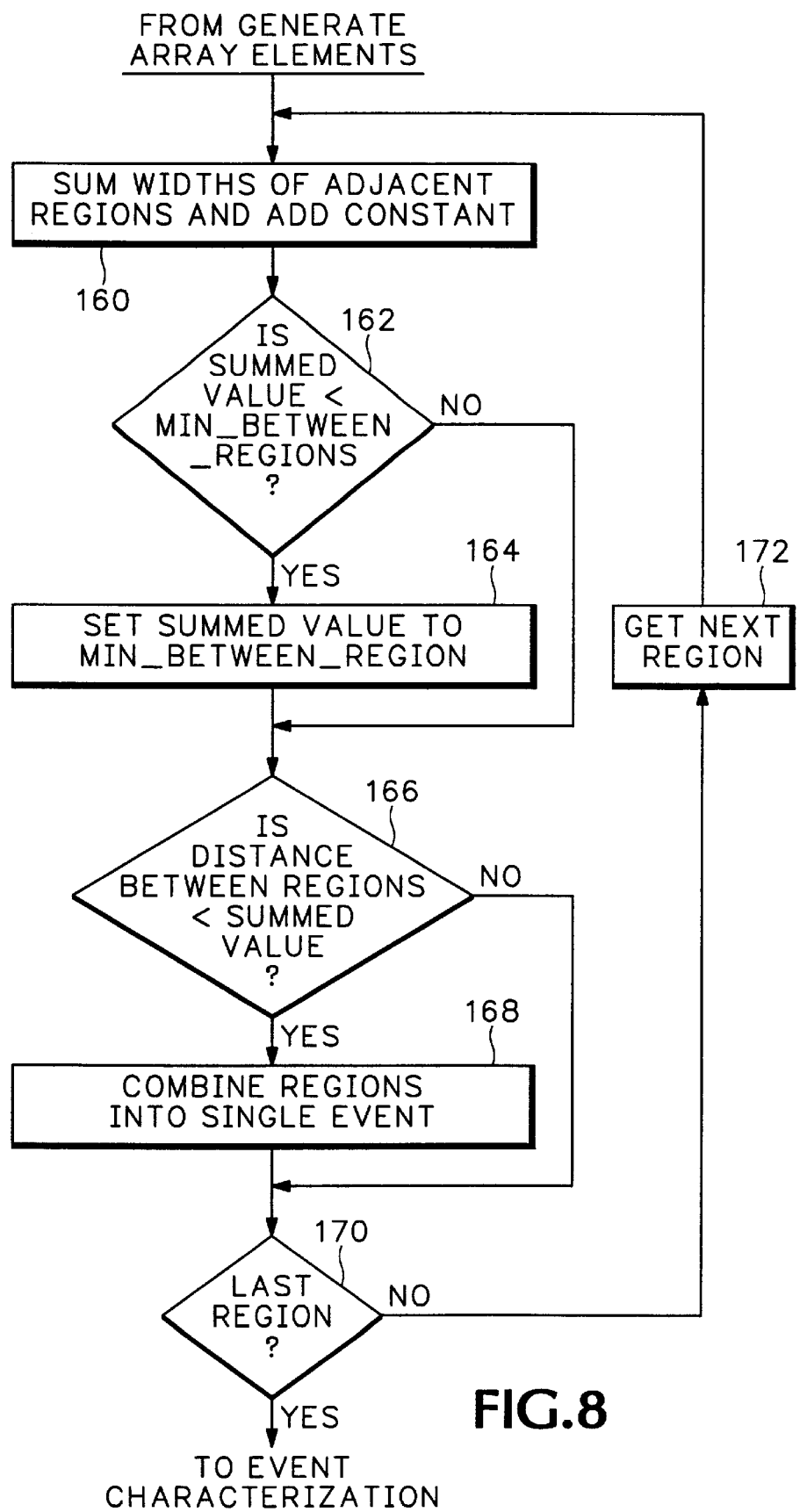
FIG. 8 is a flow chart showing the steps in identifying contiguous regions in the deviants array in the method of characterizing events in acquired waveform data from a metallic transmission cable under test according to the present invention.

Referring to the flow chart of FIG. 8, the various regions are examined to define predominantly contiguous regions of closely grouped regions. Predominantly contiguous regions are determined using the PARTIALLY_CONTIGUOUS_TOLERANCE and the MIN_BETWEEN_REGIONS constants. The PARTIALLY_CONTIGUOUS_TOLERANCE constant is added to the sum of the widths of two adjacent regions as shown in step 160. If the summed value is less than the MIN_BETWEEN_REGIONS, then the summed value is set to the MIN_BETWEEN_REGIONS constant as shown in steps 162 and 164. If the distance between the two regions is less than the summed value of their widths plus the PARTIALLY_CONTIGUOUS_TOLERANCE constant or the MIN_BETWEEN_REGIONS constant, then the regions are considered contiguous and are combined into one region and given the type of the first region as shown in steps 166 and 168. For example, a leading positive going region of 10 array elements is separated by a count of 20 from a negative going region of 20 array elements. The sum of the regions plus the PARTIALLY_CONTIGUOUS_TOLERANCE constant is 33. The count between the events is less than the summed value, so the events are considered contiguous and the two events are combined into one and stored as a positive event. If the regions are not partially contiguous and it is not the last region, the next region in the array is processed using the same steps with the previous region for congruency as shown by steps 170 and 172. After the congruent regions have been defined, the regions are examined for characterizing the event.

Figure 9:
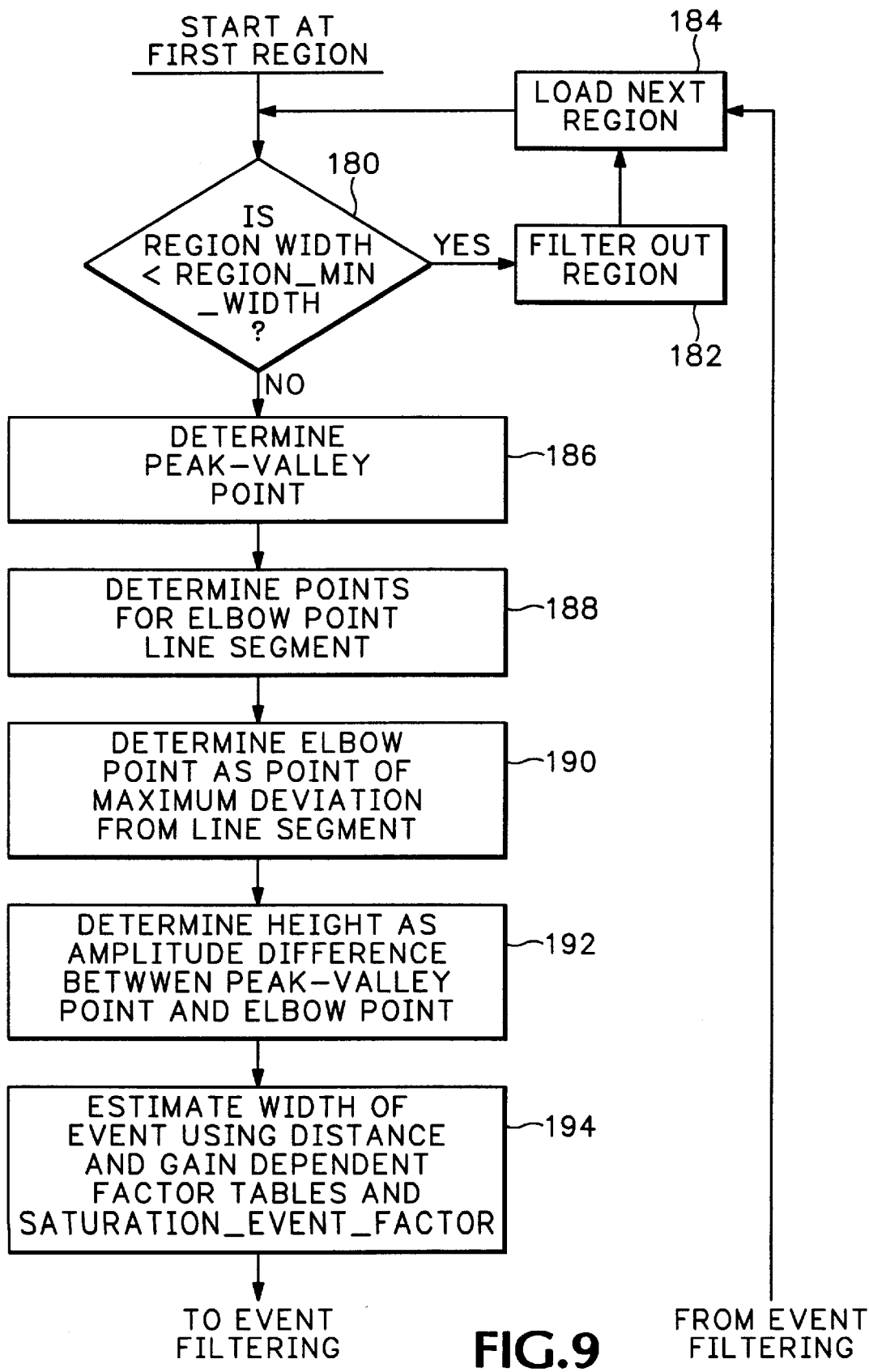
FIG. 9 is a flow chart showing the steps in producing characterization data of an event in the method of characterizing events in acquired waveform data from a metallic transmission cable under test according to the present invention.
Figure 10:
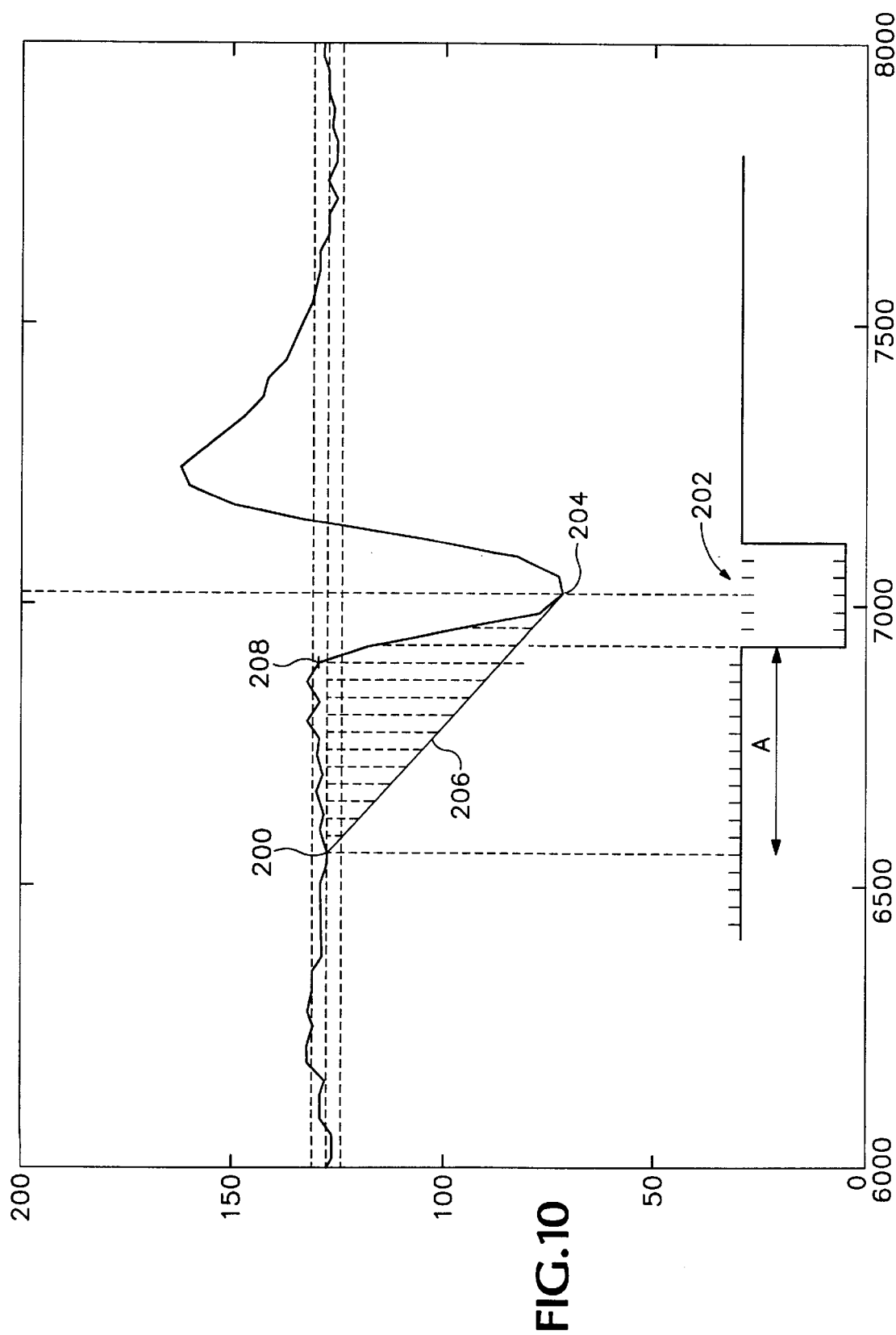
FIG. 10 is a graphical representation of an event in the waveform data showing the mathematical construction for determining the elbow point of the event in the method of characterizing events in acquired waveform data from a metallic transmission cable under test according to the present invention.

Referring to FIG. 9, the first step in the region examining process is filtering the regions in the deviants array 108 that have a region width less than the REGION_MIN_WIDTH as shown in steps 180 and 182. If the region is filtered the next region is loaded as shown in step 184 and checked for the minimum width. For regions having the required region width, the peak-valley point of the region is determined as shown in step 186. For a positive region the peak-valley point is the highest point in the section of waveform starting at the beginning of the region and ending at FIND_PEAK_VALLEY_FACTOR region widths to the right. For a negative region it the lowest point in that section. The elbow point of the region is defined to the point of maximum deviation of the waveform from a line segment drawn between two points on the waveform defined as follows: the first point is found by moving backward from the beginning of the region a distance equal to the larger of either FIND_ELBOW_LINE_FACTOR times the region width or the BOX_HALFWIDTH. The second point is the left most of either the middle of the region or the peak-valley point. The elbow determination process is shown in steps 188 and 190 and is graphically shown in the event of FIG. 10. The first point 200 is defined by taking the region width 202, which is 6, times the FIND_ELBOW_LINE_FACTOR of 2 which is 12 as shown by line marked A. The BOX_HALFWIDTH equals 10 in the preferred embodiment. The second point 204 is the peak-valley point, which in this example happens to coincide with the middle of the region 202. A line 206 is mathematically determined between the points 200 and 204 and the deviation between each waveform data point within the points 200 and 204 and the line is determined. These are shown as vertically dashed lines in FIG. 10. Waveform data point 208 has the maximum deviation from the line and is considered the elbow point. The height of the event is the vertical distance between the elbow point and the peak-valley point as shown in step 192. The width of the event is estimated by the pulsewidth times a distance and gain dependent factor as shown in step 194. Table 1 and Table 2 below respectively show the distance and gain dependent factors.

TABLE 1

| Distance in feet | Distance Factor |
| --- | --- |
| 50.0 | 1.5 |
| 100.0 | 1.5 |
| 400.0 | 2.0 |
| 1000.0 | 2.0 |
| 2000.0 | 3.0 |

TABLE 2

| Pulsewidth | Gain in dB | Gain Factor |
| --- | --- | --- |
| PW0 | 12 | 1.0 |
| PW0 | 32 | 1.5 |
| PW0 | 52 | 2.0 |
| PW0 | 100 | 4.0 |
| PW1 | 12 | 1.0 |
| PW1 | 32 | 1.5 |
| PW1 | 52 | 1.5 |
| PW1 | 100 | 3.0 |
| PW2 | 12 | 0.5 |
| PW2 | 32 | .075 |
| PW2 | 52 | 2.0 |
| PW2 | 100 | 2.0 |

The width of an event is a function of the pulsewidth of the interrogating pulse. Events farther out in the cable tend to be wider than events closer to the instrument. The width of an event also increases as a function of the receiver gain. The width of the event increases along with the receiver gain. For these reasons, distance and gain dependent factors are used for estimating the width of the event and the end point of the event. If the distance of the event is less than 50 feet from the instrument, the distance factor is 1. From 50 feet to less than 100 feet, the distance factor is factor is 1.5. From 100 feet to less than 400 feet, the distance factor is 1.5 and so on as shown in Table 1. The gain factor table takes into account the pulse width of the interrogating pulses and the gain of the receiver. In the preferred embodiment of the invention, the pulsewidth PW0=4.00 nanoseconds, pulsewidth PW1=6.00 nanoseconds, and pulsewidth PW2=25.00 nanoseconds. Other interrogating pulsewidths may be used with corresponding changes to the distance and gain factor tables without departing from the scope of the present invention. For receiver gain up to 12 dB, the gain factor for the respective pulsewidths are 1.0, 1.0 and 0.5. For receiver gains greater than 12 dB and equal to 32 dB the respective gain factors are 1.5, 1.5 and 0.75 and so on as shown in Table 2. The estimate width of the event is determined by multiplying the pulsewidth of the interrogating pulse that the waveform data is acquired at times the distance factor and multiplying this result by the gain factor for the gain at which the waveform data was acquired at. The resultant estimated pulsewidth is added to the elbow point value to estimate the end point of the event. Alternately, the estimated pulsewidth of the event can be stored in the event table and the end point calculated by adding the estimated pulsewidth to the beginning of the event.

Figure 11:
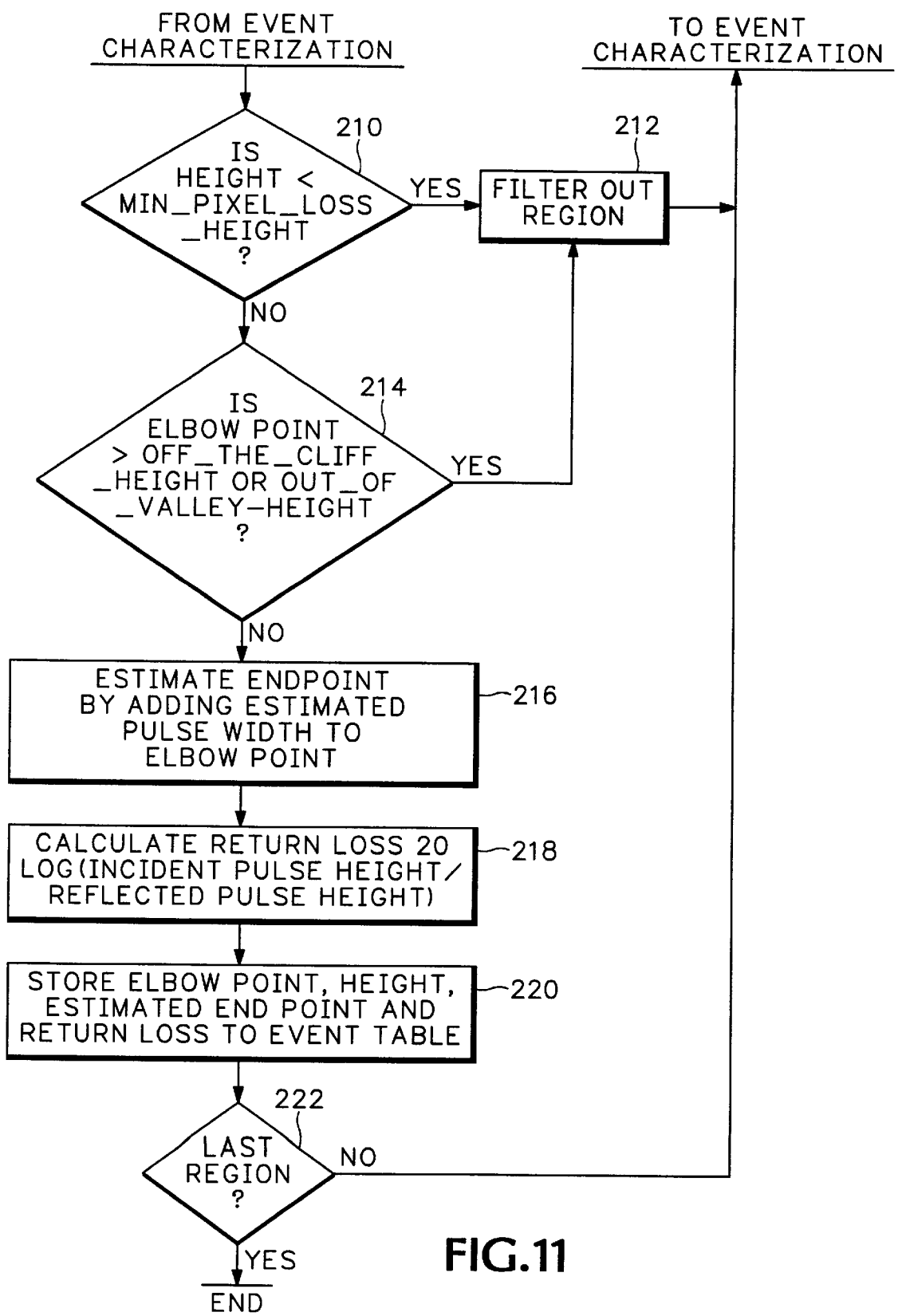
FIG. 11 is a flow chart showing the steps in event filtering and data storing in the method of characterizing events in acquired waveform data from a metallic transmission cable under test according to the present invention.

Referring to FIG. 11, the event is filtered out if the height of the event is less than MIN_PIXEL_LOSS_HEIGHT as shown in steps 210 and 212. When an event saturates the receiver electronics, it takes time for the electronics to unsaturate. This widens the event. The SATURATED_EVENT_FACTOR is used to widen the estimated width of the saturated events by adding the SATURATED_EVENT_FACTOR times the distance between the elbow point of the event and the point where the event goes below the SATURATION_TOP for positive events or above the SATURATION_BOTTOM for negative events. The region is filtered out if the elbow point is higher than OFF_THE_CLIFF_HEIGHT or lower than the OUT_THE_VALLEY_HEIGHT as shown in steps 214 and 212. This filters out saturated events which can have large, flat areas on the top or bottom. Alternately, the saturated events can be stored in the event table and a congruent event filter, to be described below, can filter out the saturated events. When an event is filtered out, the next region is loaded as shown in step 184 of FIG. 9 and the event characterized. The remaining non-filtered regions are considered valid events and are promoted to a potential event. An estimate of the end point of the event is determined by adding the estimated pulsewidth to the elbow point as shown in step 216. The return loss of the event is calculated using the formula RL=20 log(incident pulse height/reflected event height) as shown in step 218. The elbow point, height of the event, the estimated end point and the return loss are loaded into the event table as shown in step 220. Alternately, the estimated pulsewidth may be loaded into the event table instead of the estimated end point and the estimated end point is calculated from the event table characterization data by adding the estimated pulsewidth to the elbow point. The characterization process is performed on each of the regions in the deviants array as shown by step 222.

Figure 12:
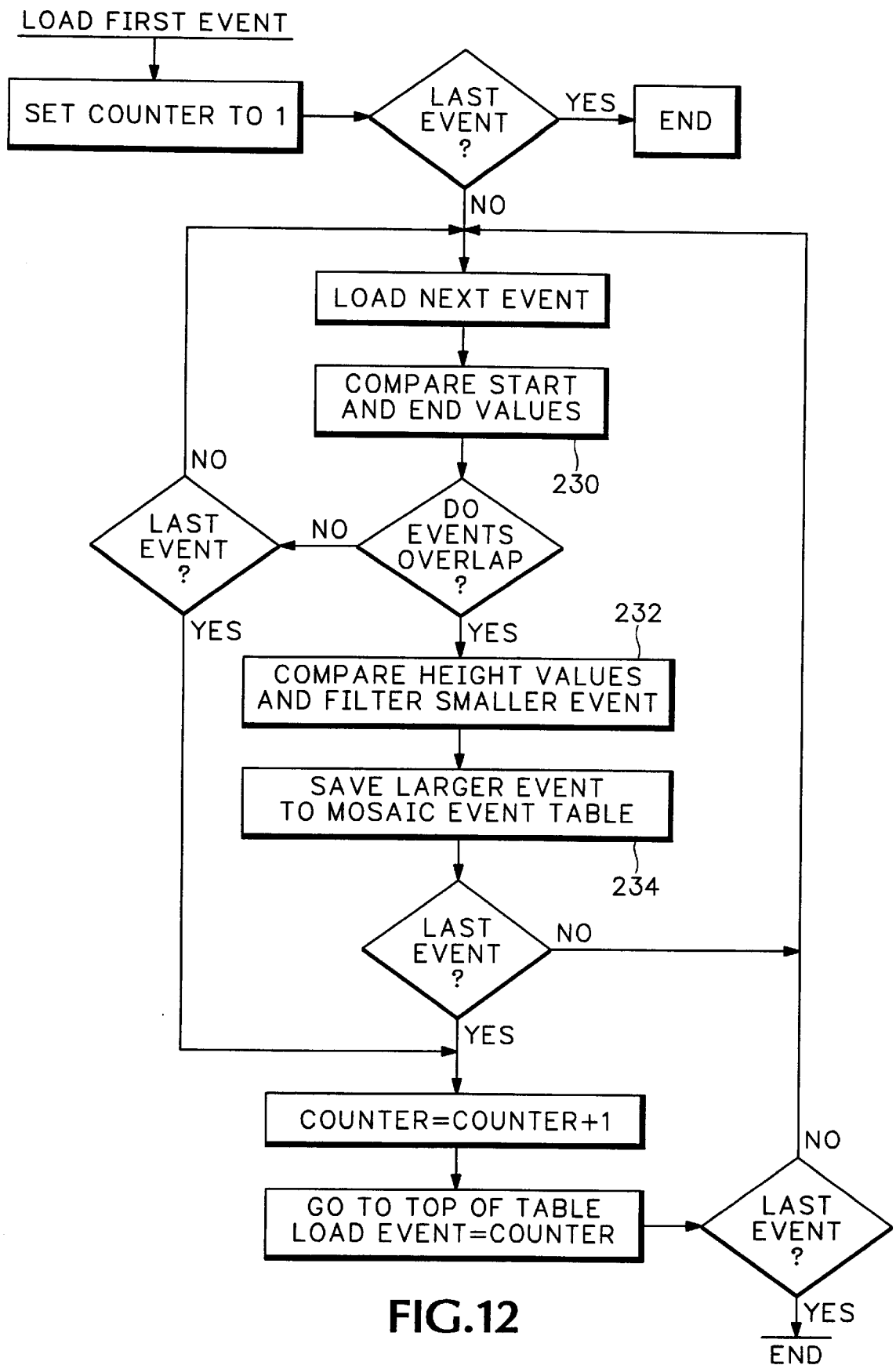
FIG. 12 is a flow chart showing the steps in congruent event filtering in the method characterizing events in acquired waveform data from a metallic transmission cable under test according to the present invention.

If event marking is on, congruent events in the event table are detected and filtered using a congruent event filter to produce a single event at a particular location as shown in the flow chart of FIG. 12. The filter compares the start and end points of events to determine if any of the events are overlapped as shown in step 230. If two or more events are found to overlap, the heights are compared as shown in step 232 and the largest height event is saved to a mosaic event table containing the same characterization data as the event table of FIG. 4 as shown in step 234. As shown by the decision steps and counter, all of the events are compared to each other to determine if any are congruent.

An additional acquisition of waveform data is made at the gain/span setting initially input by the user and processed by the processor 34 for display on the display device 38. The acquired waveform data contains 634 data points, which is equal to the number of displayable horizontal pixel locations on the display 38. Event data from the mosaic event table is used to identify the location and characteristics of the events on the display even if the event is not visible on the display because of the user selected gain setting.

A method has been described for characterizing events in acquired time domain reflectometry data using an edge or event detector for generating an array where positive array elements represent a positive leading edge of an event and negative array elements represent a negative leading edge of an event. Predominantly contiguous groups of positive and negative array elements are identified for defining regions, and elbow points and peak-valley points are determined for the regions having location and amplitude values corresponding to one of the waveform data points. The height for the event is determined as a function of the elbow point and the peak-valley point and the elbow point representing the location of the event and the event height are stored. The edge detector covers a defined number of waveform data points and moves over the waveform data point by point averaging the data within the detector; calculating an estimated noise characteristic and determining top and bottom threshold values at each data point. The thresholds are calculated as the estimated noise characteristic times a constant above the averaged waveform data within the detector. The elbow point is determined as the maximum deviation of the waveform data point from a line defined in relation to the peak-valley point and a point prior to the region in the waveform data. The event is filtered if it has a width smaller than a region width constant, or an event height less than a height constant, or an elbow point amplitude greater than saturation event constants. The event loss is calculated and stored as well as the receiver gain setting for the event and the pulsewidth of the interrogating pulse for the event. The stored data provides a thorough characterization of the event.

It will be obvious to those having skill in the art that many changes may be made to the details of the above-described embodiments of this invention without departing from the underlying principles thereof. The scope of the present invention should, therefore, be determined only by the following claims.

What is claimed is:

1. A method of characterizing events in acquired waveform data from a metallic transmission cable wherein the waveform data is an array of data points acquired at selected pulsewidths for the interrogating pulses and receiver gain settings with each point having a location value and an amplitude value comprising the steps of:

a) generating a deviant array representative of an event in the acquired waveform data wherein positive array elements represent a positive leading edge of an event in the waveform data and negative array elements represent a negative leading edge of an event in the waveform data;

b) identifying a contiguous group of positive or negative array elements defining a region containing a single event, contiguous positive array elements defining a positive region and contiguous negative array elements defining a negative region;

c) determining an elbow point as a point of maximum bend at the beginning of the single event and a peak-valley point as the maximum amplitude of the single event for the region having location and amplitude values corresponding to one of the waveform data points;

d) determining a height for the event as a function of the elbow point and the peak-valley point; and e) storing the elbow point representing the location of the event and the event height in an event table.

2. The method for characterizing events in acquired waveform data as recited in claim 1 wherein the generating step further comprises the steps of:

a) establishing a starting point in the waveform data for generating the deviant array;

b) defining a detector containing a defined number of waveform data points for generating the array elements;

c) averaging the waveform data within the detector;

d) calculating an estimated noise characteristic of the waveform data within the detector;

e) calculating a top threshold value as the estimated noise characteristic times a constant value above the averaged waveform data within the detector for comparing with waveform data point amplitude values for generating array elements;

f) calculating a bottom threshold value as the estimated noise characteristic times a constant value below the averaged waveform data within the detector for comparing with waveform data point amplitude values for generating array elements;

g) establishing a data point distance beyond the detector for comparing the threshold values with the waveform data point amplitude values;

h) establishing a detector advancement rate; and i) advancing the detector over the waveform data points and repeating steps c, d, e and f of the generating step for each advancement of the detector.

3. The method for characterizing events in acquired waveform data as recited in claim 2 wherein the starting point establishing step further comprises the steps of:

a) determining the existence of an incident pulse in the acquired waveform data; and b) moving the starting point within the waveform data by a distance equal to the pulsewidth of the incident pulse times a skip factor constant.

4. The method for characterizing events in acquired waveform data as recited in claim 2 wherein the noise characteristic calculating step further comprises the step of determining the mean absolute deviation of the waveform data within the detector.

5. The method for characterizing events in acquired waveform data as recited in claim 2 further comprising the steps of:

a) generating the positive array element when the waveform data point amplitude value is greater than the top threshold value for storing in the deviant array; and b) generating a negative array element when the waveform data point amplitude value is less than the bottom threshold value for storing in the deviant array.

6. The method for characterizing events in acquired waveform data as recited in claim 1 wherein the determining step further comprises the steps of:

a) setting the largest waveform data point amplitude value over a distance starting at the beginning of the region and ending two region widths to the right of the peak-valley point;

b) defining a line segment having a first point whose location is prior to the beginning of the region and a distance equal to the larger of either a find elbow line factor constant times the region width or a detector halfwidth constant and a second point whose location is the left most of either the middle of the region or the peak-valley point; and c) determining a point of maximum difference between waveform data point amplitude values within the line segment points and the line segment as the elbow point.

7. The method for characterizing events in acquired waveform data as recited in claim 1 further comprising the step of filtering out a region having a width smaller than a region width constant.

8. The method for characterizing events in acquired waveform data as recited in claim 1 further comprising the step of filtering out a region having an event height less than a height constant.

9. The method for characterizing events in acquired waveform data as recited in claim 1 further comprising the step of filtering out a region having an elbow point amplitude value that is greater than a saturation event constant.

10. The method for characterizing events in acquired waveform data as recited in claim 1 further comprising the step of calculating a return loss value for the event.

11. The method for characterizing events in acquired waveform data as recited in claim 10 further comprising the step of storing the return loss value for the event in the event table.

12. The method for characterizing events in acquired waveform data as recited in claim 1 further comprising the step of storing the receiver gain setting for the event and the pulsewidth of the interrogating pulses for the event in the event table.

13. The method for characterizing events in acquired waveform data as recited in claim 1 further comprising the step of repeating steps c, d and e for each region identified by step b.

* * * * *